United States Patent [19]
Christensen

[11] 3,983,838
[45] Oct. 5, 1976

[54] PLANETARY EVAPORATOR

[75] Inventor: Richard Gilbert Christensen, Wingdale, N.Y.

[73] Assignee: International Business Machines Corporation, Armonk, N.Y.

[22] Filed: Dec. 31, 1975

[21] Appl. No.: 645,768

[52] U.S. Cl. .................................. 118/49; 118/53; 118/500; 269/57
[51] Int. Cl.[2] .......................................... C23C 11/08
[58] Field of Search..... 118/319, 500, 503, 48–49.5, 118/53, 52, 54; 269/57; 427/50–52, 69, 70, 78, 91, 109, 124, 248–253, 240, 241

[56] References Cited
UNITED STATES PATENTS

| | | | |
|---|---|---|---|
| 3,046,157 | 7/1962 | Nyman | 118/53 X |
| 3,332,392 | 7/1967 | Gessner et al. | 118/503 X |
| 3,486,237 | 12/1969 | Sawicki | 118/500 X |
| 3,534,707 | 10/1970 | Riddle | 118/48 |
| 3,598,083 | 10/1971 | Dort | 118/48 |
| 3,853,091 | 12/1974 | Christensen et al. | 118/49 |
| 3,858,547 | 1/1975 | Bergfelt | 118/49 |
| 3,889,632 | 6/1975 | Brunner et al. | 118/49.1 |

*Primary Examiner*—Morris Kaplan
*Attorney, Agent, or Firm*—William J. Dick

[57] ABSTRACT

A planetary evaporator having at least one source of material for coating, by evaporation, workpieces such as semiconductor wafers. The apparatus includes a pallet mounted for rotation about its own axis, and substrate or workpiece holders mounted on the pallet which orbit said axis. Guides support the pallets and a cam follower on the pallet follows a cam to effect reciprocation of the pallet as it rotates, the guides being adapted for rotation about another axis which is substantially perpendicular to the axis of rotation of the pallet. In another embodiment the substrate holders are also rotated so as to give four degrees of freedom of the workpiece or substrate relative to the material source.

10 Claims, 8 Drawing Figures

U.S. Patent  Oct. 5, 1976  Sheet 3 of 3  3,983,838
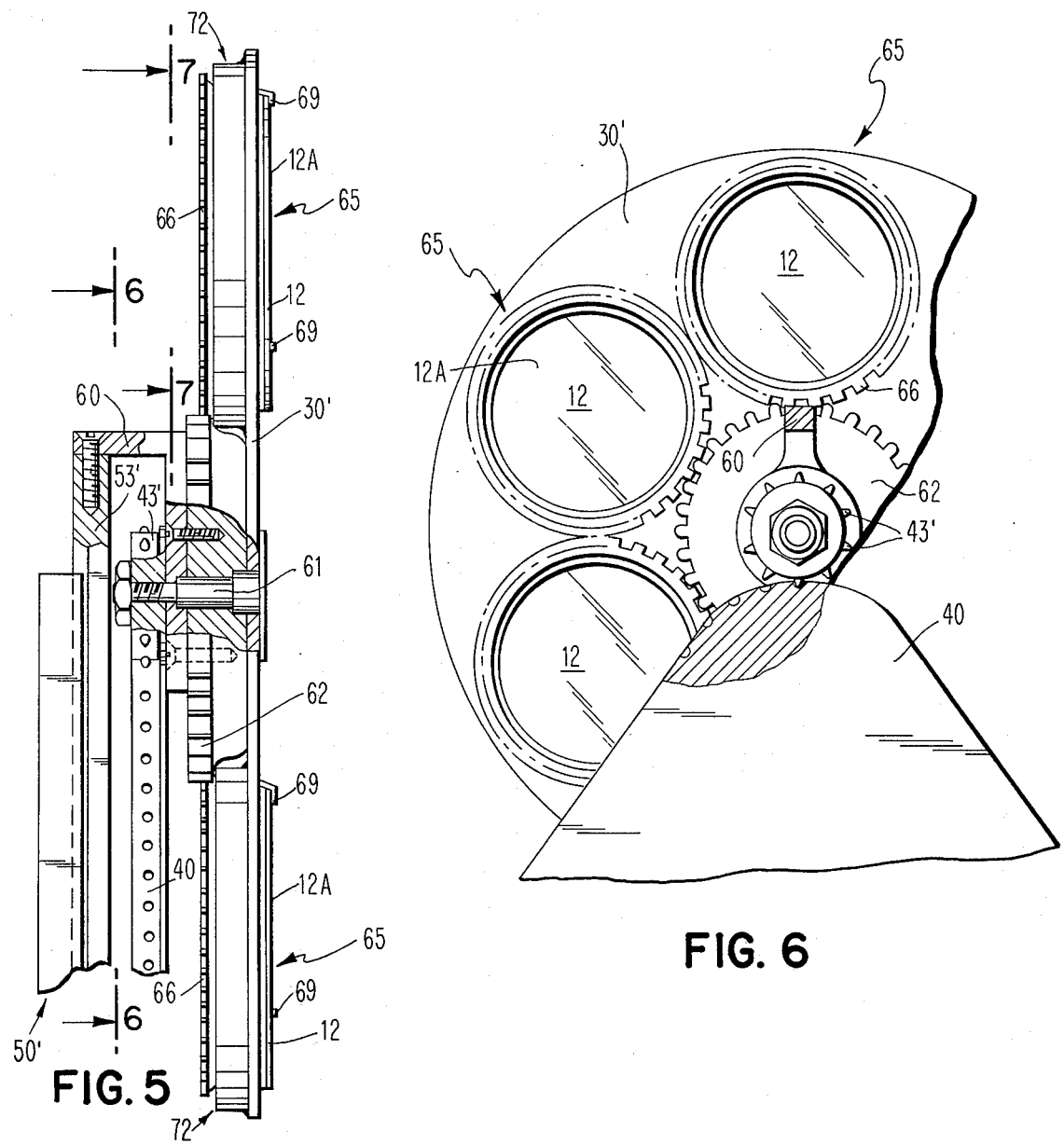
FIG. 5
FIG. 6
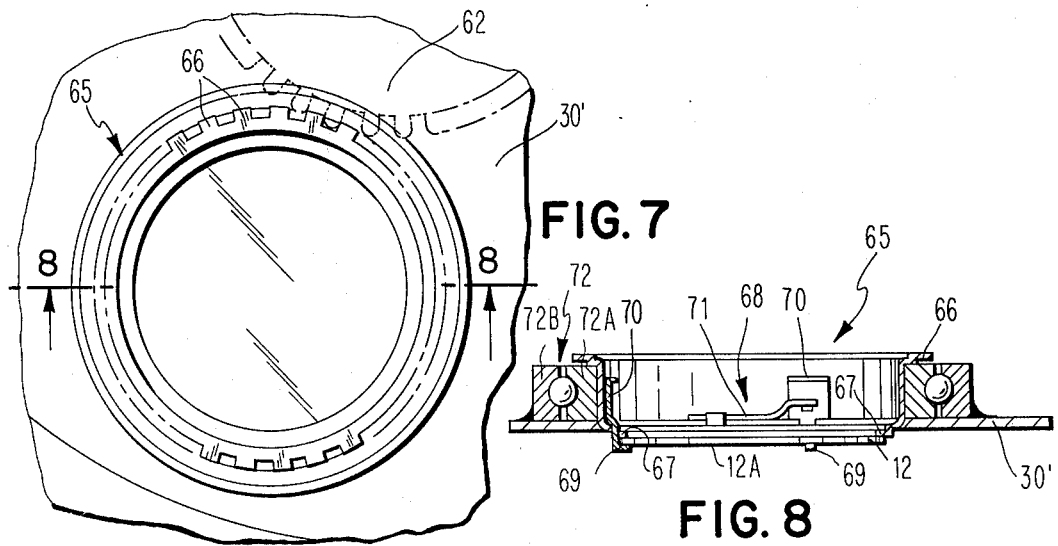
FIG. 7
FIG. 8

PLANETARY EVAPORATOR

SUMMARY OF THE INVENTION AND STATE OF THE PRIOR ART

The present invention relates to apparatus for coating at least one and preferably a plurality of workpieces such as semiconductor wafers, and more particularly relates to evaporation apparatus for assuring a uniform coating of at least one surface of a semiconductor wafer by providing, in conjunction with a complex motion, reciprocation of the object as it is rotated relative to the evaporation source so as to further insure uniform coating of the workpiece.

There have been many attempts to insure uniform coating of irregular surfaces of objects during a coating operation. When the objects are semiconductor wafers it has been found that providing a complex motion of the wafer aids materially in the formation of a uniform coating. For example, U.S. Pat. No. 3,598,083 to Dort illustrates a thin film coating apparatus having three degrees of freedom (rotation in that case) wherein the central axis of the substrates of objects being coated is oblique to the axis of the source material crucible. While such apparatus does perform relatively well by coating uniformly as compared with a single rotation or even double rotation type holder, it has been found that it is difficult if not impossible to achieve uniformity of coating in certain topographies wherein depressions or protrusions are to be coated, and especially where the depression has an undercut. To overcome the problem of the difficulty in uniformly coating the bottom of depressions, for example etched holes in semiconductor wafers, the apparatus disclosed in U.S. Pat. No. 3,853,091 issued on Dec. 10, 1974 to the present inventor is preferred. In the latter instance, the apparatus employed a single plane with multiple rotation to achieve the desired surface coating. However, even with the coating apparatus such a disclosed in U.S. Pat. No. 3,853,091, as long as the rotation is uniform the distance of certain portions of the object being coated, for example the center of the semiconductor wafer, sees the evaporant material or source at a different rate then the rotation perimeter of the object or semiconductor wafer sees the evaporant material. For example, if a disc is rotating about its own or first axis and is also rotating about an axis perpendicular to the first axis, with a source of material located offset from the first axis but along the second axis of rotation, material being evaporated onto the rotating disc will cause more material to be deposited near the lower portion of the disc (that point that is closest to the source) and less at a point opposite on the disc. However, the same quantity of material will be deposited at all times on the central or first axis of the disc resulting in a pyramiding of the deposited material upon the disc.

Accordingly, it has been discovered that if the entire disc can be made to reciprocate as it is rotated into and out of the stream of evaporant material and its source of heat supply, then the coating becomes more uniform and the center of the disc is not coated more or less than the periphery of the disc.

In view of the above, it is a principal object of the present invention to provide a planetary evaporator in which the object workpiece upon which is deposited the evaporant material receives at least three degrees of freedom during the evaporant process, at least one of which degrees of freedom is reciprocation so that all parts of the workpiece are exposed as uniformly as possible to the distribution of both film evaporant and temperature.

Another object of the present invention is to provide a planetary evaporator in which multiple semiconductor wafers may be processed and receive a uniform film across the wafers by the novel action of the machine, location of heating sources and evaporant sources relative to the movement of the wafer.

Yet another object of the present invention is to provide an evaporator which will permit of a continuous and high evaporation rate on the order of 85 angstroms per second without effecting a spattering of material from and on the semiconductor wafer.

Other objects and a more complete understanding of the invention may be had by referring to the following specifications and claims taken in conjunction with the accompanying drawings in which:

FIG. 5 is a view similar to FIG. 3 except with a modified embodiment wherein it is desired to provide four degrees of freedom for the objects to be coated by evaporant material;

FIG. 6 is a fragmentary sectional view taken along lines 6—6 of FIG. 5;

FIG. 7 is an enlarged fragmentary view of the portion of the apparatus illustrated in FIG. 6; and FIG. 8 is a fragmentary sectional view taken along line 8—8 of FIG. 7.

Figure 1:
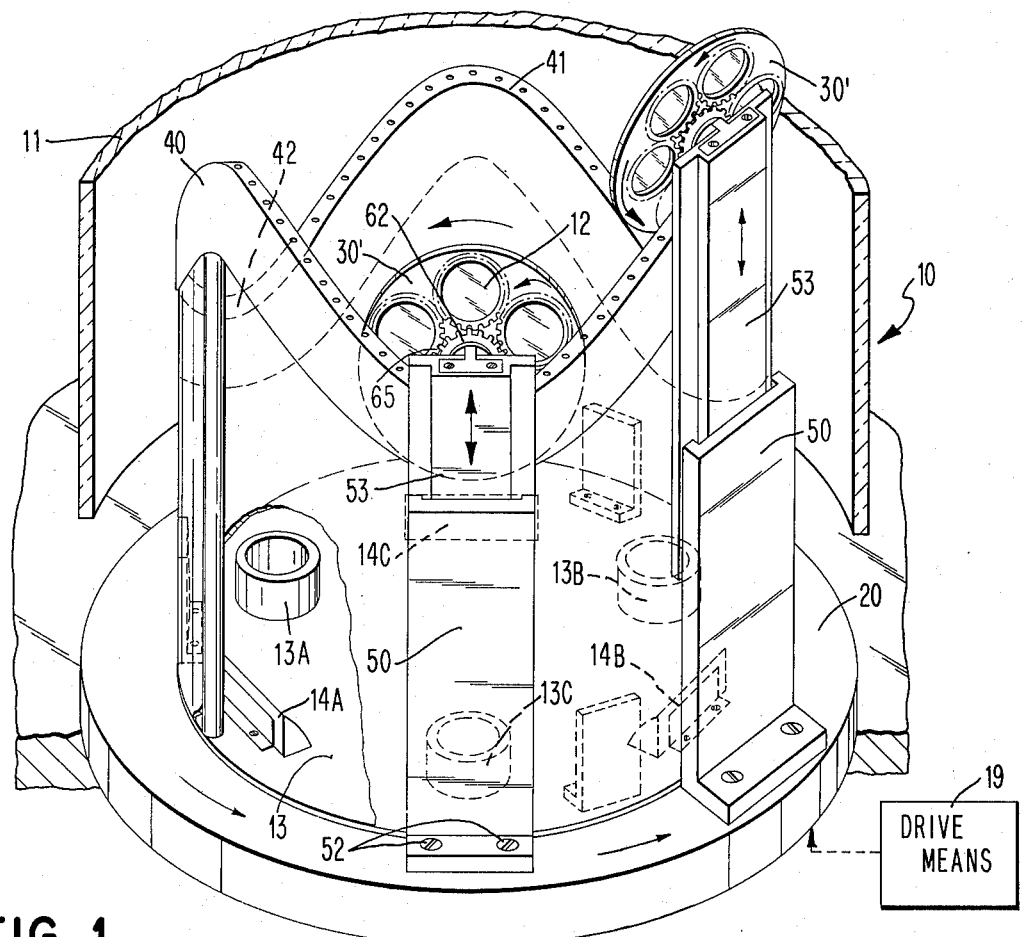
FIG. 1 is a fragmentary perspective view of a portion of apparatus constructed in accordance with the present invention.

Referring now to the drawings, and especially FIG. 1 thereof, a planetary evaporator 10 constructed in accordance with the present invention is illustrated therein. The evaporator apparatus includes a conventional coating chamber or vacuum envelope 11 which is connected to a source of vacuum (not shown) to evacuate the chamber in accordance with customary or usual practice.

Figure 2:
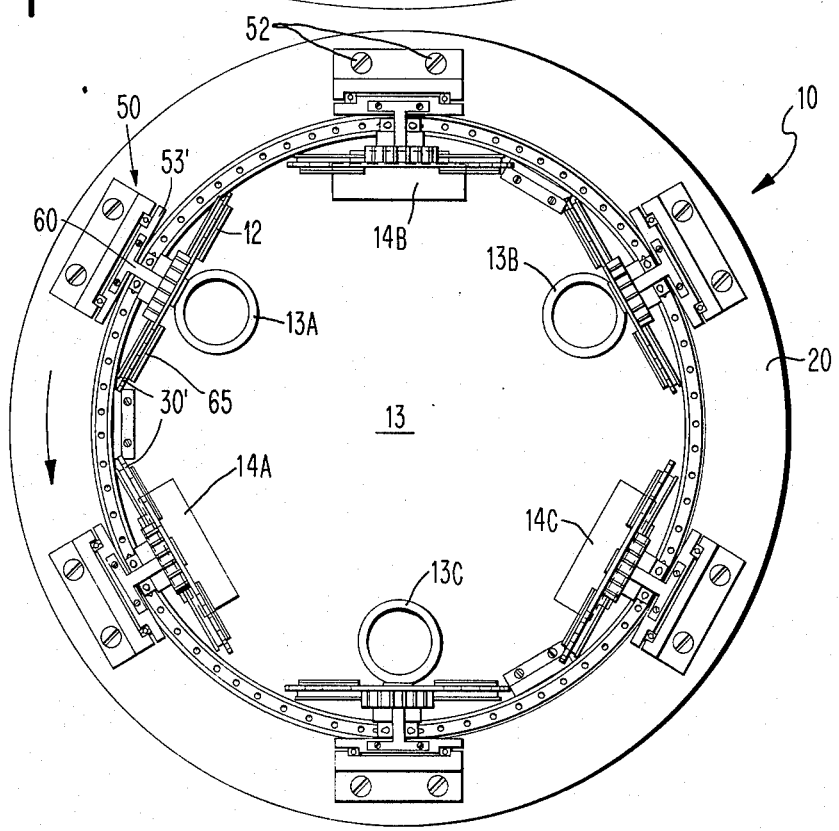
FIG. 2 is a fragmentary view in plan of the apparatus illustrated in FIG. 1.

In accordance with the invention the planetary evaporator 10 provides at least three degrees of freedom or movement of workpieces (for example thin wafer like semiconductor wafers 12) at least one of which movements is a reciprocation of the workpiece so as to maximize uniformity of coating and thermal gradients across the wafer. To this end, and as best shown in FIGS. 1 and 2, the apparatus includes a base plate 13 having mounted thereon at least one material receiving means, in the illustrated instance material receiving receptacles or cups 13A, 13B and 13C which hold the material to be evaporated, which cups or receptacles are heated by means (not shown) to effect the evaporation. As shown the material receiving means or cups are spaced apart adjacent the periphery of the base plate 13, and intermediate the receptacles are positioned heater elements 14, designated 14A, 14B and 14C respectively, the heater elements also being spaced apart adjacent the peripheral edge of the base plate and arranged so to direct their heat upwardly through the imaginary central axis of the base plate 13 towards the workpieces 12. The heaters are preferably of the quartz tungsten type to effect a direct radiation of heat upon the semiconductor wafer. For reasons which will become more clear hereinafter, a ring 20 circumscribes the base plate and drive means 19 are coupled, in the present invention, to the ring 20 for effecting relative movement between the ring and the base plate.

In order to provide both reciprocation and rotation of the object or workpiece 12 with at least three degrees of freedom, the wafers or workpieces are mounted on pallets 30' facing inwardly towards the central axis of the base plate 13 and thus the material evaporation receptacles 13A–13C as well as the heaters 14A–14C. As is described hereinafter, the pallets 30 are mounted for both rotation and reciprocation, each pallet being rotated about its own central axis, and orbited about a second axis which is the central axis of the base plate (and thus the axes are mutually perpendicular) and reciprocated in a plane, in the present instance, parallel to the central axis of the base plate. It should be noted that the pallets 30' illustrated in FIGS. 1 and 2 are associated with the pallet and wafer holder construction illustrated in FIGS. 5, 6, 7 and 8; the pallets 30' being displayed in FIGS. 1 and 2 for ease of reader viewing and correct placement of the various parts. The pallet 30, alluded to hereafter is specific to the structure displayed in FIG. 3, and, for purposes of the following discussion is assumed used in place of the pallet 30. To this end, and referring to FIGS. 1–3, a cam ring 40 is mounted on the base plate 13, the cam ring including peaks 41 and depression 42 so that as the ring 20 is rotated, reciprocation of the pallets is effected.

Mounted on the ring 20 are upstanding guide means 50 which are spaced about the cam 40, in the present instance there being one such guide means for each hill and valley or depression 41 and 42 respectively of the cam ring 40. The guide means 50 may take many forms, in the present instance slides best illustrated in the cross section of FIG. 4, and include a way portion 51 connected to the ring 20 as by screws 52, and a movable or carriage portion 53 which is connected to the way portion 51 as by crossed roller bearings 54. A slide 50, such as illustrated in FIG. 4, may be purchased from Micro-Slides Inc. at 629 Main Street, Westbury, N.Y. 11590. Connected to the carriage or movable portion 53 of the slide or guide means 50 is a shaft 55 (see FIG. 3) which forms the axis for the pallet 30. As illustrated best in FIG. 3, the pallet 30 is mounted on a sleeve bearing 31 for rotation about the shaft 55, the outer portion of the pallet 30 being connected to a cam follower 43 which coacts with the cam 40 so that as the ring 20 rotates about the base plate 13, the pallet 30 also rotates as well as reciprocates because of the follower action of the cam follower 43 riding over the hills 41 and valleys 42 of the cam ring. To insure proper follower action, the cam follower may be provided with teeth 44 which coact with apertures or depression 45 in the cam 40 thus insuring rotation of the pallet 30.

Figure 3:
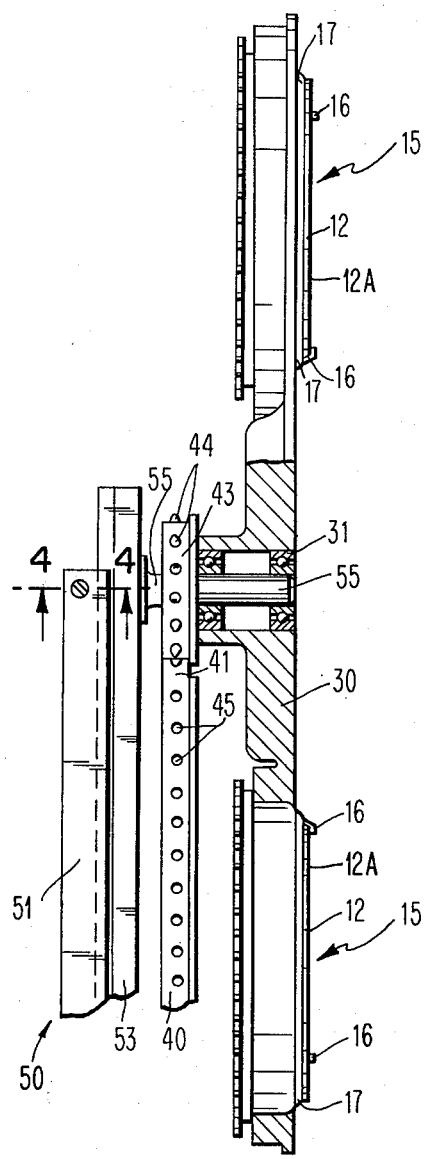
FIG. 3 is an enlarged fragmentary sectional view in size elevation of a portion of the apparatus illustrated in FIGS. 1 and 2.
Figure 4:
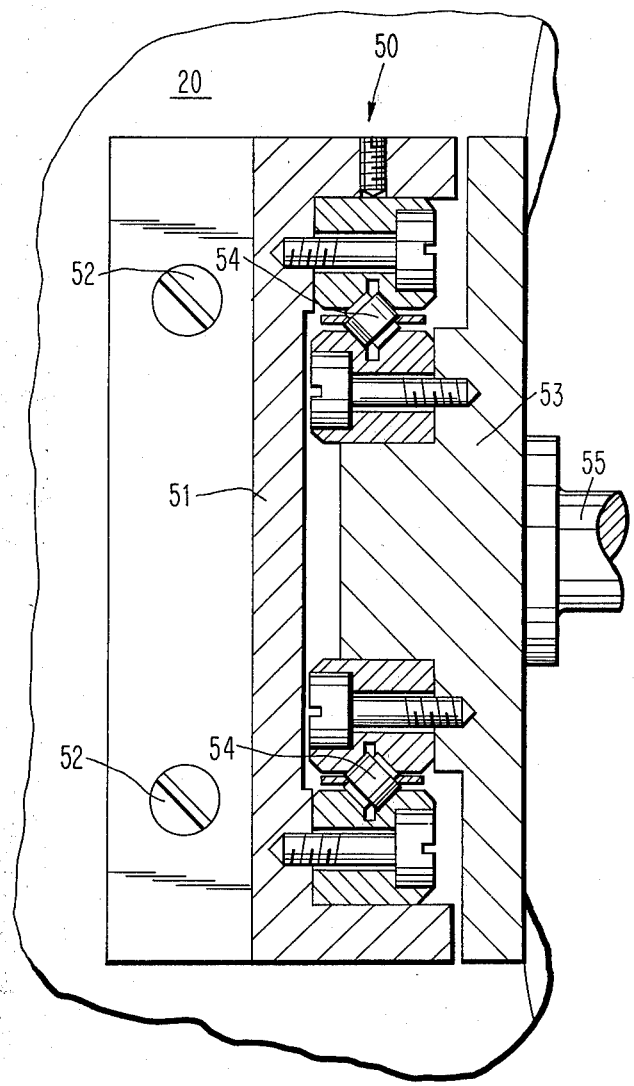
FIG. 4 is an enlarged fragmentary sectional view taken along line 4—4 of FIG. 3.

The wafers 12 may be connected to the pallet in any number of ways, for example, as best illustrated in FIG. 3, a cup or the like 15 having spring like tangs 16 at spaced apart intervals on the periphery of the cup may serve to press the wafer against the lip 17 of the cup thereby exposing the wafer 12 to the material to be evaporated from the receptacle 13 as well as exposing the wafers to radiation from the heating elements 14.

In certain instances it may be desirable to provide even a more uniform coating on the wafers by providing four degrees of freedom to the workpiece or wafer 12. To this end, and referring now to FIGS. 5 and 6, the guide means 50' illustrated in FIG. 5 are identical to the guide means illustrated in FIG. 4 and heretofore described. However, in the embodiment shown and hereinafter described, not only does the pallet rotate but so also does each individual wafer holder. In the embodiment shown the slide carriage 53' is connected as by an offset clamp to a gear 62. A shaft 61, journaled for rotation in the gear and the clamp 60 is connected to the cam follower 43' and the modified pallet 3'. Thus as the cam follower 43' rotates following the cam 40, the pallet 30' rotates while the gear 62 remains fixed. In order to provide rotation of an individual workpiece, wafer holding cups 65 are provided (see FIGS. 6, 7 and 8) which are substantially identical to the cups described in U.S. Pat. No. 3,853,091, issued on Dec. 10, 1974 to the present inventor. The cups 65 have a toothed lip 66 which co-acts with the fixed gear 62 and are mounted for rotation within the pallet so that as the pallet rotates, the holders 65 tend to walk around the gear 62 thereby imparting rotation to the cups. As shown best in FIG. 8, each cup 65 has an inwardly projecting circumferentially extending lip portion 67 on its lower portion thereof, and wafer retaining means 68 for retaining a wafer or workpiece 12 on the lower portion of the cup, against the lip 67 so as to expose the surface 12A of the wafer to the source material and the heat from the heating sources. The wafer retaining means 68 includes a plurality of clip like retainers each of which includes a tang 69 which is bent inwardly to overly the lip 67 of the cup and to capture the wafer 12 and press the wafer against the lip 67. The tang 69 of the clip extends through the peripheral lip 67 of the cup into the interior of the cup where it terminates in an enlarged spade like section 70. A spring retainer 71, associated with the clip serves to bias the enlarged spade like section 70 against the wall of the cup thereby forcing the tang section against the periphery of the wafer 12. In this manner, when it is desied to remove a wafer from a lip, the spade like section 70 may be biased away from the wall. The cup is mounted for rotation in the pallet 30' as by a ball bearing 72, the inner race 72A of which is suitably detented to capture the wall of the cup 65 while the outer race 72B of which is suitably connected to the pallet 30'.

Thus the embodiment illustrated in FIGS. 5, 6, 7 and 8 is capable of four degrees of freedom inasmuch as the wafer or object 12 rotates about the central axis of the base 13 by way of the driving motion of the ring 20, it rotates about the central axis of the pallet by way of rotation of the shaft due to the rotation of the cam follower 43', the pallet reciprocates due to the hill and valley motion of the cam 40, and the individual wafer holder 65 rotates about its own axis.

Although the invention has been described with a certain degree of particularity, it is understood that the present disclosure has been made only by way of example and that numerous changes in the details of construction and the combination and arrangement of parts and the mode of operation may be made without departing from the spirit and the scope of the invention as hereinafter claimed.

What is claimed is:

1. A planetary evaporator comprising in combination; a base member, at least on source of material for evaporation operatively associated therewith, an annular member circumscribing said base member; at least one guide means fixed to one of said base member and said annular member and projecting therefrom; a cam ring concentric with said annular member and mounted on the other of said base member and annular member from said guide means; a slide element mounted for reciprocatory movement in said guide means, a pallet including means for supporting substrates thereon, said pallet rotatably mounted on said element; said cam ring having a varying effective altitude, and in driving relationship with said reciprocable and rotatable pallet; and means to effect relative movement between said cam ring and said annular member whereby said pallet achieves an effective orbit about the axis of relative movement and the relative motion between the pallet and the cam ring effects both rotation of the pallet about its own axis and reciprocation of said slide and said pallet whereby substrates carried on said pallet are exposed to said at least one source to effect uniform coating of said material.

2. A planetary evaporator in accordance with claim 1 wherein said pallet includes a cam follower which coacts with said cam ring to permit follower movement of said pallet upon said relative movement occurring between said cam ring and said pallet to effect said rotation and reciprocation.

3. A planetary evaporator in accordance with claim 1 wherein said base member is stationary and includes means mounting said source of material for evaporation, and said annular member is mounted for rotation about said base member.

4. A planetary evaporator in accordance with claim 2 including means for rotating said substrate holders relative to said rotating pallet so as to provide at least four degrees of freedom for a substrate mounted on said holder.

5. A planetary evaporator in accordance with claim 1 including a plurality of spaced apart material sources on said base member, and at least one heater element, mounted on said base member, and directed upwardly through the central axis of said base member towards said pallet.

6. A planetary evaporator in accordance with claim 2 wherein said slide element includes a carriage, and means connecting said carriage to said pallet.

7. A planetary evaporator in accordance with claim 6 including a shaft projecting from said carriage and connected thereto, means to connect said pallet to said shaft to permit rotation thereof and reciprocation of said pallet upon follower movement of said cam follower.

8. A planetary evaporator in accordance with claim 6 wherein said means connecting said carriage to said pallet comprises a fixed gear connected to said carriage, a shaft mounted for rotation within said gear, said pallet and said cam follower being connected to said shaft for rotation therewith.

9. A planetary evaporator in accordance with claim 8 wherein said means for supporting substrates thereon comprises a cup shaped receptacle having a toothed lip portion, means mounting said receptacle to said pallet to permit rotation of said receptacle relative to said pallet, said toothed lip portion engaging said fixed gear whereby rotation of said pallet effects rotation of said receptacle around said gear.

10. A planetary evaporator comprising in combination: at least one source of material for evaporation; a rotatable annular member operatively associated with said at least one source; at least one guide means fixed to said member and extending normal thereto, a slide element mounted for reciprocatory movement in said guide, a pallet including a substrate support thereon, said pallet rotatably mounted on said element, a fixed cam ring concentric with said member, having a varying effective altitude and in driving relationship with said reciprocable and rotatable pallet, and means to rotate said annular member whereby the pallet is orbited about the axis of member rotation and the relative motion between the substrate support and fixed cam ring effects both rotation of the support about its own axis and reciprocation of said slide and said support and whereby substrates carried on said support are exposed to said at least one source to effect uniform coding of said material.

* * * * *